(12) United States Patent
Yoshimi

(10) Patent No.: US 11,689,164 B2
(45) Date of Patent: Jun. 27, 2023

(54) MULTI-BAND POWER AMPLIFIER MODULE

(71) Applicant: Murata Manufacturing Co., Ltd., Kyoto (JP)

(72) Inventor: Syunji Yoshimi, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/933,231

(22) Filed: Sep. 19, 2022

(65) Prior Publication Data

US 2023/0016198 A1     Jan. 19, 2023

Related U.S. Application Data

(63) Continuation of application No. 16/796,197, filed on Feb. 20, 2020, now Pat. No. 11,451,198, which is a
(Continued)

(30) Foreign Application Priority Data

May 16, 2017    (JP) .................................. 2017-097149
Oct. 2, 2017    (JP) .................................. 2017-192846

(51) Int. Cl.
*H03F 3/68*      (2006.01)
*H03F 3/21*      (2006.01)
(Continued)

(52) U.S. Cl.
CPC ............ *H03F 3/211* (2013.01); *H03F 1/0211* (2013.01); *H03F 3/19* (2013.01); *H03F 3/195* (2013.01);
(Continued)

(58) Field of Classification Search
CPC .......... H03F 3/211; H03F 1/0211; H03F 3/19; H03F 3/195; H03F 3/245; H03F 3/68;
(Continued)

(56) References Cited

U.S. PATENT DOCUMENTS 7,664,475 B2    2/2010    Ichihara
7,688,158 B2    3/2010    Rohani et al.
(Continued)

FOREIGN PATENT DOCUMENTS

CN      103814526 A    5/2014
WO     2017/077852 A1    5/2017

*Primary Examiner* — Khanh V Nguyen
(74) *Attorney, Agent, or Firm* — Pearne & Gordon LLP

(57) ABSTRACT

A multi-band power amplifier module includes at least one transmission input terminal, at least one power amplifier circuit that receives a first transmission signal and a second transmission signal through the at least one transmission input terminal, a first filter circuit that allows the first transmission signal to pass therethrough, a second filter circuit that allows the second transmission signal to pass therethrough, at least one transmission output terminal through which the first and second transmission signals output from the first and second filter circuits are output, a transmission output switch that outputs each of the first and second transmission signals output from the at least one power amplifier circuit to the first filter circuit or the second filter circuit, and a first tuning circuit that adjusts impedance matching between the at least one power amplifier circuit and the at least one transmission output terminal.

5 Claims, 6 Drawing Sheets

Related U.S. Application Data continuation of application No. 15/979,843, filed on May 15, 2018, now Pat. No. 10,608,603.

(51) Int. Cl.

| | | |
|---|---|---|
| *H03F 1/02* | (2006.01) | |
| *H03F 3/19* | (2006.01) | |
| *H03F 3/195* | (2006.01) | |
| *H03F 3/24* | (2006.01) | |
| *H03F 3/72* | (2006.01) | |
| *H04B 1/04* | (2006.01) | |
| *H04B 1/16* | (2006.01) | |

(52) U.S. Cl.
CPC .............. *H03F 3/245* (2013.01); *H03F 3/68* (2013.01); *H03F 3/72* (2013.01); *H04B 1/04* (2013.01); *H04B 1/0483* (2013.01); *H03F 2200/111* (2013.01); *H03F 2200/171* (2013.01); *H03F 2200/231* (2013.01); *H03F 2200/294* (2013.01); *H03F 2200/387* (2013.01); *H03F 2200/39* (2013.01); *H03F 2200/414* (2013.01); *H03F 2200/429* (2013.01); *H03F 2200/451* (2013.01); *H03F 2203/21109* (2013.01); *H03F 2203/21139* (2013.01); *H03F 2203/21157* (2013.01); *H03F 2203/21175* (2013.01); *H03F 2203/7209* (2013.01); *H03F 2203/7215* (2013.01); *H03F 2203/7221* (2013.01); *H03F 2203/7236* (2013.01); *H04B 1/16* (2013.01); *H04B 2001/0408* (2013.01)

(58) Field of Classification Search
CPC ................. H03F 3/72; H03F 2200/111; H03F 2200/171; H03F 2200/231; H03F 2200/294; H03F 2200/387; H03F 2200/39; H03F 2200/414; H03F 2200/429; H03F 2200/451; H03F 2203/21109; H03F 2203/21139; H03F 2203/21157; H03F 2203/21175; H03F 2203/7209; H03F 2203/7215; H03F 2203/7221; H03F 2203/7236; H03F 1/26; H03F 1/56; H03F 3/189; H03F 3/20; H03F 3/24; H03F 2200/372; H03F 3/602; H04B 1/04; H04B 1/16; H04B 2001/0408
USPC ........................................ 330/124 R, 126, 29
See application file for complete search history.

(56) References Cited

U.S. PATENT DOCUMENTS

| | | | |
|---|---|---|---|
| 9,002,309 | B2 | 4/2015 | Sahota et al. |
| 9,595,933 | B2 | 3/2017 | Zhao et al. |
| 9,712,197 | B2 * | 7/2017 | Ripley ..................... H03F 3/24 |
| 9,825,660 | B2 | 11/2017 | Wloczysiak et al. |
| 10,084,411 | B2 | 9/2018 | Lehtola |
| 2009/0085689 | A1 | 4/2009 | Rohani et al. |
| 2014/0329475 | A1 | 11/2014 | Ella |
| 2016/0119015 | A1 | 4/2016 | Ku |
| 2016/0322997 | A1 | 11/2016 | Wloczysiak et al. |
| 2018/0248569 | A1 | 8/2018 | Takenaka |

\* cited by examiner

MULTI-BAND POWER AMPLIFIER MODULE

This is a continuation of U.S. patent application Ser. No. 16/796,197 filed on Feb. 20, 2020, which is a continuation of U.S. patent application Ser. No. 15/979,843 filed on May 15, 2018, which claims priority from Japanese Patent Application No. 2017-192846 filed on Oct. 2, 2017 and Japanese Patent Application No. 2017-097149 filed on May 16, 2017. The contents of these applications are incorporated herein by reference in their entireties.

The present disclosure relates to a multi-band power amplifier module. Against the backdrop of high-density packaging for mobile communication terminals such as cellular phones, studies are being made on the reduction in the number of components by sharing various components such as an antenna switch, an input switch, an output switch, a duplexer, a power amplifier circuit, a low-noise amplifier circuit, and a matching circuit.

For example, U.S. Patent Application Publication No. 2016/0119015 discloses a power amplifier module having M inputs and N outputs, each of at least two or more of the M inputs being coupled to a switch that separates paths. The power amplifier module includes a plurality of filter circuits and a single power amplifier circuit.

With the recent increase in communication traffic handled by a mobile communication terminal, communication technology called carrier aggregation (CA) in which a plurality of frequency ranges (bands) are simultaneously used is under development. Using CA, a mobile communication terminal can increase its communication speed or communication quality.

However, U.S. Patent Application Publication No. 2016/0119015 does not describe a configuration of the power amplifier module for supporting CA. For example, in a configuration supporting CA, it is conceivable that an output terminal of a power amplifier circuit is connected to a single path or connected to two paths. In this case, the matching state between an output impedance of the power amplifier circuit and a load impedance changes depending on whether the output terminal is connected to a single path or to two paths. Thus, when the power amplifier module described in U.S. Patent Application Publication No. 2016/0119015 is applied to CA, the degree of impedance matching may decrease and the efficiency of amplification of transmission signals using the power amplifier module may be reduced.

BRIEF SUMMARY

The present disclosure provides a multi-band power amplifier module with improved efficiency of amplification of transmission signals.

According to some embodiments of the present disclosure, a multi-band power amplifier module includes at least one transmission input terminal, at least one power amplifier circuit that receives a first transmission signal and a second transmission signal through the at least one transmission input terminal, a first filter circuit that allows the first transmission signal to pass therethrough, a second filter circuit that allows the second transmission signal to pass therethrough, at least one transmission output terminal through which the first and second transmission signals output from the first and second filter circuits are output, a transmission output switch that outputs each of the first and second transmission signals output from the at least one power amplifier circuit to the first filter circuit or the second filter circuit, and a first tuning circuit that adjusts impedance matching between the at least one power amplifier circuit and the at least one transmission output terminal.

According to other embodiments of the present disclosure, a multi-band power amplifier module includes at least one transmission input terminal that receives a first transmission signal and a second transmission signal, at least one power amplifier circuit that receives the first transmission signal and the second transmission signal through the at least one transmission input terminal, a first filter circuit that allows the first transmission signal to pass therethrough, a second filter circuit that allows the second transmission signal to pass therethrough, at least one transmission output terminal through which the first and second transmission signals output from the first and second filter circuits are output, a transmission input switch that outputs each of the first and second transmission signals input through the at least one transmission input terminal to one of the at least one power amplifier circuit, and a first tuning circuit that adjusts impedance matching between the at least one power amplifier circuit and the at least one transmission output terminal.

According to embodiments of the present disclosure, it may be possible to provide a multi-band power amplifier module with improved efficiency of amplification of transmission signals.

Other features, elements, characteristics and advantages of the present disclosure will become more apparent from the following detailed description of embodiments of the present disclosure with reference to the attached drawings.

DETAILED DESCRIPTION

Embodiments of the present disclosure will be described hereinafter with reference to the drawings. In a second embodiment and the subsequent embodiments, the same or similar constituent elements as or to those in a first embodiment are identified with the same or similar numerals as or to those in the first embodiment and are not described in detail, as appropriate. In addition, advantages achieved by the second embodiment and the subsequent embodiments that are similar to those achieved by the first embodiment are not described, as appropriate. The drawings illustrating the embodiments are illustrative and are not to scale, and the technical scope of the present disclosure should not be construed as being limited to these embodiments.

First Embodiment

Figure 1:
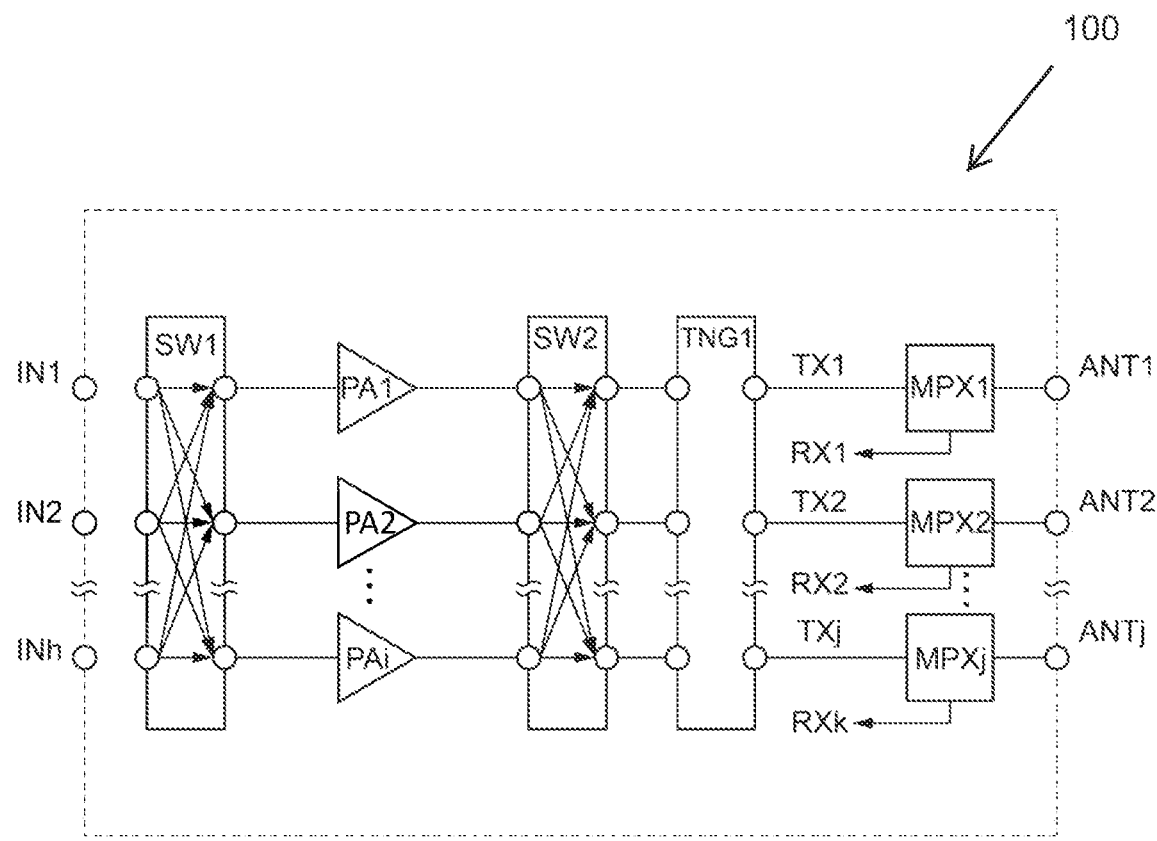
FIG. 1 is a block diagram schematically illustrating a circuit configuration of a multi-band power amplifier module according to a first embodiment.

First, the configuration of a multi-band power amplifier module 100 according to a first embodiment of the present disclosure will be described with reference to FIG. 1. FIG. 1 is a block diagram schematically illustrating a circuit configuration of the multi-band power amplifier module 100 according to the first embodiment.

The multi-band power amplifier module 100 is a radio-frequency (RF) module included in a mobile communication terminal such as a cellular phone supporting a carrier aggregation (CA) scheme and configured to amplify the power of a transmission signal to a level necessary to transmit the transmission signal to a base station. The transmission signal is, for example, a radio frequency (RF) signal modulated in accordance with a predetermined communication scheme by using a radio frequency integrated circuit (RFIC) or the like.

The CA scheme is a communication scheme for simultaneously sending and receiving a plurality of transmission signals and a plurality of reception signals to and from a base station by using a plurality of frequency ranges (bands). The CA scheme provides improvements in communication speed or connection stability compared with a communication scheme for transmission and reception using a single band. The bands used in the multi-band power amplifier module 100 are not limited specifically and can be selected appropriately from among, for example, Evolved Universal Terrestrial Radio Access (E-UTRA) band 1 (uplink: 1920 MHz-1980 MHz, downlink: 2110 MHz-2170 MHz), . . . , and band 255.

The multi-band power amplifier module 100 may support any of intra-band contiguous CA, intra-band non-contiguous CA, and inter-band non-contiguous CA. Intra-band contiguous CA uses contiguous component carriers (CCs) in the same band as a plurality of transmission signals to be amplified. Intra-band non-contiguous CA uses non-contiguous CCs in the same band as a plurality of transmission signals to be amplified. Inter-band non-contiguous CA uses non-contiguous CCs in different bands as a plurality of transmission signals to be amplified.

The number of CCs to be used is not limited to any value, and the multi-band power amplifier module 100 may support 2UL-CA in which two uplink CCs are used or 3UL-CA in which three uplink CCs are used. Examples of 2UL-CA include a combination of band 2 (uplink: 1850 MHz-1910 MHz) and band (uplink: 699 MHz-716 MHz), a combination of band 4 (uplink: 1710 MHz-1755 MHz) and band 12, a combination of band 3 (uplink: 1710 MHz-1785 MHz) and band 41 (uplink: 2496 MHz-2690 MHz), and a combination of band 8 (uplink: 880 MHz-915 MHz) and band 41. Examples of 3UL-CA include a combination of band 2, band 12, and band 30, and a combination of band 4, band 12, and band 30.

The multi-band power amplifier module 100 includes a plurality of transmission input terminals IN1, IN2, . . . , and INh, a transmission input switch SW1, a plurality of power amplifier circuits PA1, PA2, . . . , and PAi, a transmission output switch SW2, a first tuning circuit TNG1, a plurality of multiplexers (filter circuits) MPX1, MPX2, . . . , and MPXj, and a plurality of transmission output terminals ANT1, ANT2, . . . , and ANTj. The multi-band power amplifier module 100 amplifies a plurality of transmission signals TX1, TX2, . . . , and TXj. The multi-band power amplifier module 100 further includes a configuration (not illustrated) for amplifying received signals and is capable of amplifying a plurality of received signals RX1, RX2, . . . , and RXk. The multi-band power amplifier module 100 may not be configured to amplify received signals.

The plurality of transmission input terminals IN1, IN2, . . . , and INh are terminals through which the plurality of transmission signals TX1, TX2, . . . , and TXj are input from the outside to the multi-band power amplifier module 100. For example, the transmission signal TX1 is input through the transmission input terminal IN1, and the transmission signal TX2 is input through the transmission input terminal IN2. In the example configuration illustrated in FIG. 1, h is an integer greater than or equal to 3, and the multi-band power amplifier module 100 includes h transmission input terminal IN1, IN2, . . . , and INh. In the example configuration illustrated in FIG. 1, furthermore, j is an integer greater than or equal to 3, and the multi-band power amplifier module 100 amplifies and outputs j transmission signals TX1, TX2, . . . , and TXj. It is desirable that the multi-band power amplifier module 100 be capable of amplifying at least two transmission signals and the number of transmission signals j be greater than or equal to 2. When the plurality of transmission signals TX1, TX2, . . . , and TXj of different CCs are respectively input through the plurality of transmission input terminals IN1, IN2, . . . , and INh, the number of transmission input terminals is equal to the number of transmission signals, that is, h=j.

A plurality of transmission signals may be input through a single transmission input terminal. For example, the transmission signals TX1 and TX2 may be input through the transmission input terminal IN1. In the multi-band power amplifier module 100, therefore, the number of transmission input terminals may be smaller than the number of transmission signals, that is, h<j. It is desirable that the multi-band power amplifier module 100 include at least one transmission input terminal, that is, 1≤h≤j.

The transmission input switch SW1 outputs each of the plurality of transmission signals TX1, TX2, . . . , and TXj, which are input through the plurality of transmission input terminals IN1, IN2, . . . , and INh, to one of the plurality of power amplifier circuits PA1, PA2, . . . , and PAi. The multi-band power amplifier module 100, which includes the transmission input switch SW1, can selectively input each of the plurality of transmission signals TX1, TX2, . . . , and TXj to a suitable power amplifier circuit. If the CCs of the plurality of transmission signals TX1, TX2, . . . , and TXj input to the multi-band power amplifier module 100 change, the transmission input switch SW1 can switch paths in accordance with the changes of the CCs. Thus, the reduction in the efficiency of amplification of transmission signals can be prevented or minimized. The transmission input switch SW1 is optional. That is, a specific transmission input terminal may be fixedly connected to each of a plurality of power amplifier circuits.

The transmission input switch SW1 may output a plurality of transmission signals to a single power amplifier circuit or may output a plurality of transmission signals to different power amplifier circuits. For example, when the respective CCs of the transmission signals TX1 and TX2 are close to each other or are identical, the transmission input switch SW1 outputs the transmission signals TX1 and TX2 to the power amplifier circuit PA1. When the respective CCs of the transmission signals TX1 and TX2 are far apart from each other, the transmission input switch SW1 outputs the transmission signal TX1 to the power amplifier circuit PA1 and outputs the transmission signal TX2 to the power amplifier circuit PA2.

The plurality of power amplifier circuits PA1, PA2, . . . , and PAi amplify the power of the plurality of transmission signals TX1, TX2, . . . , and TXj, which are input through the transmission input switch SW1, and output the resulting transmission signals TX1, TX2, . . . , and TXj. In the example illustrated in FIG. 1, i is an integer greater than or equal to 3, and the multi-band power amplifier module 100 includes i power amplifier circuits PA1, PA2, . . . , and PAi.

The multi-band power amplifier module 100 may include any number of power amplifier circuits so long as the plurality of transmission signals TX1, TX2, . . . , and TXj can be amplified. For example, when the respective CCs of the transmission signals TX1 and TX2 are close to each other, the power amplifier circuit PA1 may be capable of amplifying both the transmission signals TX1 and TX2. Thus, the number i of power amplifier circuits may be greater than or equal to at least one and less than or equal to the number h of transmission input terminals. That is, it is desirable that $1 \leq i \leq h$. Accordingly, a reduction in the number i of power amplifier circuits results in a reduced size or cost of the multi-band power amplifier module 100.

The transmission output switch SW2 outputs the plurality of transmission signals TX1, TX2, . . . , and TXj, which are output from the plurality of power amplifier circuits PA1, PA2, . . . , and PAi, to the plurality of multiplexers MPX1, MPX2, . . . , and MPXj, respectively. The multi-band power amplifier module 100, which includes the transmission output switch SW2, can selectively input each of the plurality of transmission signals TX1, TX2, . . . , and TXj to a suitable multiplexer. If the CCs of the plurality of transmission signals TX1, TX2, . . . , and TXj output from the plurality of power amplifier circuits PA1, PA2, . . . , and PAi change, the transmission output switch SW2 can switch paths in accordance with the changes of the CCs. Thus, loss of transmission signals due to the presence of multiplexers can be reduced.

The transmission output switch SW2 may connect a single power amplifier circuit to a plurality of multiplexers or may connect each of a plurality of power amplifier circuits to a different multiplexer. For example, the power amplifier circuit PA1 amplifies the transmission signals TX1 and TX2. In this case, the transmission output switch SW2 simultaneously selects a first path for outputting the transmission signal TX1 from the power amplifier circuit PA1 to the multiplexer MPX1 and a second path for outputting the transmission signal TX2 from the power amplifier circuit PA1 to the multiplexer MPX2. Alternatively, the power amplifier circuit PA1 amplifies the transmission signal TX1, and the power amplifier circuit PA2 amplifies the transmission signal TX2. In this case, the transmission output switch SW2 selects a first path for outputting the transmission signal TX1 from the power amplifier circuit PA1 to the multiplexer MPX1 and a third path for outputting the transmission signal TX2 from the power amplifier circuit PA2 to the multiplexer MPX2. Thus, the number i of power amplifier circuits may be smaller than the number j of multiplexers. Accordingly, a reduction in the number i of power amplifier circuits results in a reduced size and cost of the multi-band power amplifier module 100.

The first tuning circuit TNG1 adjusts the impedance matching state between the plurality of power amplifier circuits PA1, PA2, . . . , and PAi and the plurality of transmission output terminals ANT1, ANT2, . . . , and ANTj. The first tuning circuit TNG1 is connected between the transmission output switch SW2 and the plurality of multiplexers MPX1, MPX2, . . . , and MPXj. The first tuning circuit TNG1 includes, for example, a digitally tunable capacitor (DTC). The multi-band power amplifier module 100, which includes the first tuning circuit TNG1, can prevent or minimize the reduction in the efficiency of amplification of a transmission signal caused by a change in matching state between an output impedance of a power amplifier circuit and a load impedance. In a configuration including the transmission output switch SW2 capable of selecting a path that connects a power amplifier circuit and a multiplexer, if the matching state between an output impedance of a power amplifier circuit and a load impedance changes depending on the path selected by the transmission output switch SW2, the first tuning circuit TNG1 can appropriately adjust impedance matching.

As an example, when the transmission output switch SW2 simultaneously selects the first and second paths as paths to be connected to the power amplifier circuit PA1, the impedance matching state is different from that when only the first path is selected as a path to be connected to the power amplifier circuit PA1. For example, a circuit design is made such that the output impedance of the power amplifier circuit PA1 is matched to the load impedance when only the first path is selected as a path to be connected to the power amplifier circuit PA1. In this case, the first tuning circuit TNG1 adjusts impedance matching in accordance with a change in impedance matching state, thereby preventing or minimizing the reduction in the efficiency of amplification of the transmission signal TX1 when the transmission output switch SW2 simultaneously selects the first and second paths. Also, for the second path, the first tuning circuit TNG1 adjusts impedance matching, thereby preventing or minimizing the reduction in the efficiency of amplification of the transmission signal TX2.

As another example, the multi-band power amplifier module 100 changes the output level of the transmission signal TX1, that is, the magnification of the transmission signal TX1 at the power amplifier circuit PA1, in accordance with the distance between the mobile communication terminal and the base station. For example, a circuit design is made such that the output impedance of the power amplifier circuit PA1 is matched to the load impedance when the transmission signal TX1 output from the power amplifier circuit PA1 to the multiplexer MPX1 has a specific output level. In this case, the first tuning circuit TNG1 adjusts the impedance matching state in accordance with the output level of the transmission signal TX1, thereby preventing or minimizing the reduction in the efficiency of amplification of the transmission signal TX1.

It is desirable that the first tuning circuit TNG1 be capable of preventing or minimizing the reduction in the efficiency of amplification of at least one transmission signal among at least two transmission signals to be amplified in the multi-band power amplifier module 100. For example, the first tuning circuit TNG1 may be configured to override preventing or minimizing the reduction in the efficiency of amplification of the most important transmission signal of at least two transmission signals while permitting the efficiency of amplification of the other transmission signal(s) to remain reduced.

The first tuning circuit TNG1 may be connected between the plurality of power amplifier circuits PA1, PA2, . . . , and PAi and the transmission output switch SW2. That is, the first tuning circuit TNG1 may be connected to the plurality of power amplifier circuits PA1, PA2, . . . , and PAi, the transmission output switch SW2 may be connected to the first tuning circuit TNG1, and the plurality of multiplexers MPX1, MPX2, . . . , and MPXj may be connected to the transmission output switch SW2. This configuration can also adjust the impedance matching state in accordance with paths of the plurality of transmission signals TX1, TX2, . . . , and TXj that are selected by the transmission output switch SW2.

The plurality of multiplexers MPX1, MPX2, . . . , and MPXj correspond to filter circuits that allow transmission signals of different CCs to pass therethrough. Each multiplexer may be a duplexer. The multi-band power amplifier module 100 includes at least two multiplexers to amplify and output at least two transmission signals of different CCs. For example, the multiplexer MPX1 allows the transmission signal TX1 to pass therethrough and blocks the transmission signal TX2. The multiplexer MPX2 blocks the transmission signal TX1 and allows the transmission signal TX2 to pass therethrough. In the example illustrated in FIG. 1, j is an integer greater than or equal to 3, and the multi-band power amplifier module 100 includes j multiplexers MPX1, MPX2, . . . , and MPXj.

The plurality of transmission output terminals ANT1, ANT2, . . . , and ANTj are coupled to the plurality of multiplexers MPX1, MPX2, . . . , and MPXj, respectively, and output the plurality of transmission signals TX1, TX2, . . . , and TXj, respectively. The plurality of transmission output terminals ANT1, ANT2, . . . , and ANTj are connected to external antennas. For example, the transmission output terminal ANT1 outputs the transmission signal TX1 output from the multiplexer MPX1, and the transmission output terminal ANT2 outputs the transmission signal TX2 output from the multiplexer MPX2. The plurality of transmission output terminals ANT1, ANT2, . . . , and ANTj are capable of inputting the plurality of received signals RX1, RX2, . . . , and RXk to the plurality of multiplexers MPX1, MPX2, . . . , and MPXj.

Other embodiments will be described hereinafter. In the following embodiments, features common to the first embodiment and the following embodiments are not described but only differences are described. Elements assigned numerals similar to those of the first embodiment have configurations and functions similar to those of the elements in the first embodiment and are not described in detail. Similar operational advantages achieved by similar elements are not described.

Second Embodiment

Figure 2:
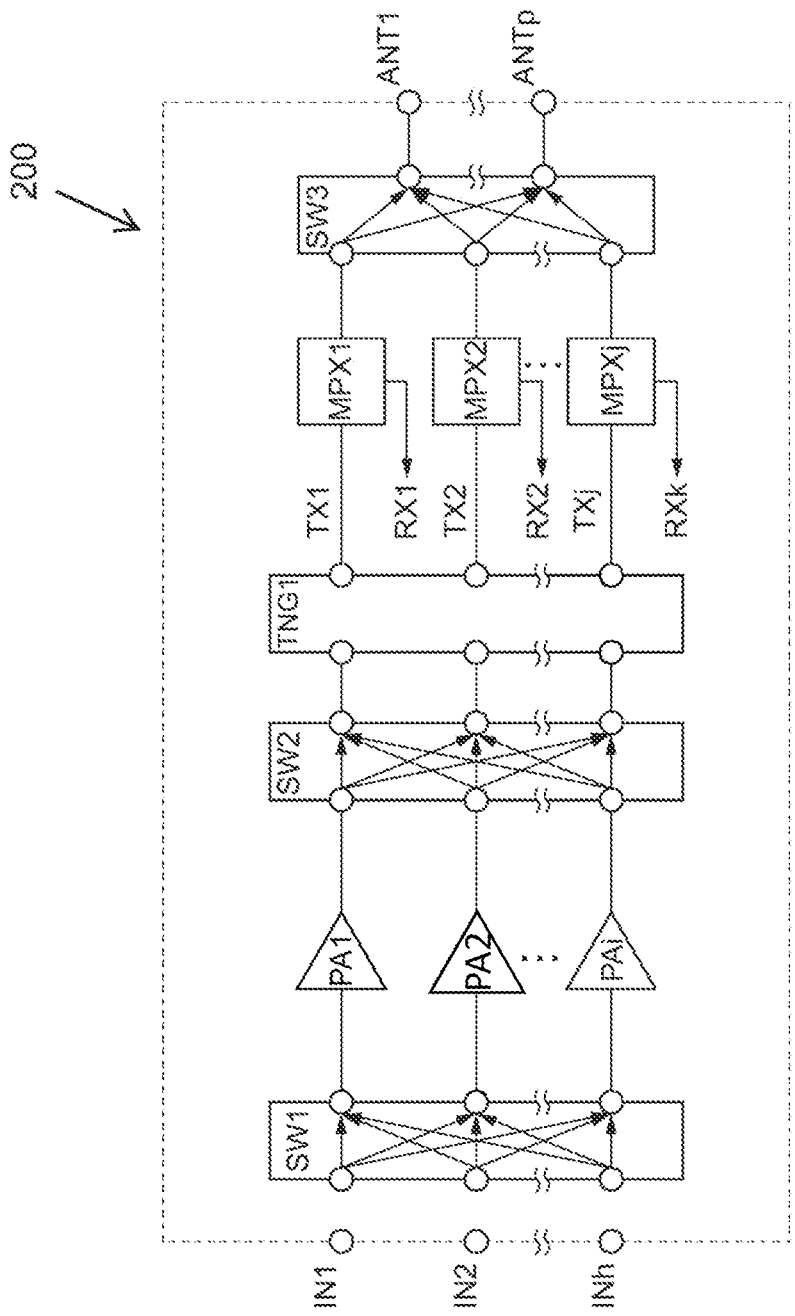
FIG. 2 is a block diagram schematically illustrating a circuit configuration of a multi-band power amplifier module according to a second embodiment.

Next, the configuration of a multi-band power amplifier module 200 according to a second embodiment of the present disclosure will be described with reference to FIG. 2. FIG. 2 is a block diagram schematically illustrating a circuit configuration of the multi-band power amplifier module 200 according to the second embodiment.

The multi-band power amplifier module 200 includes the plurality of transmission input terminals IN1, IN2, . . . , and INh, the transmission input switch SW1, the plurality of power amplifier circuits PA1, PA2, . . . , and PAi, the transmission output switch SW2, the first tuning circuit TNG1, the plurality of multiplexers MPX1, MPX2, . . . , and MPXj, and a plurality of transmission output terminals ANT1, . . . , and ANTp.

The multi-band power amplifier module 200 further includes an antenna switch SW3. The antenna switch SW3 switches paths between the plurality of multiplexers MPX1, MPX2, . . . , and MPXj and the plurality of transmission output terminals ANT1, . . . , and ANTp. In the example configuration illustrated in FIG. 2, p is an integer greater than or equal to 2, and the multi-band power amplifier module 200 includes p transmission output terminals ANT1, . . . , and ANTp. It is desirable that the multi-band power amplifier module 200 include at least one transmission output terminal, that is, 1≤p≤j.

As an example, the frequencies of the CCs of the transmission signal TX1 output from the multiplexer MPX1 and the transmission signal TX2 output from the multiplexer MPX2 are close to each other. In this case, the antenna switch SW3 can output the transmission signals TX1 and TX2 to the transmission output terminal ANT1 and can emit the transmission signals TX1 and TX2 from the same external antenna. Accordingly, the number p of transmission output terminals can be reduced.

Third Embodiment

Figure 3:
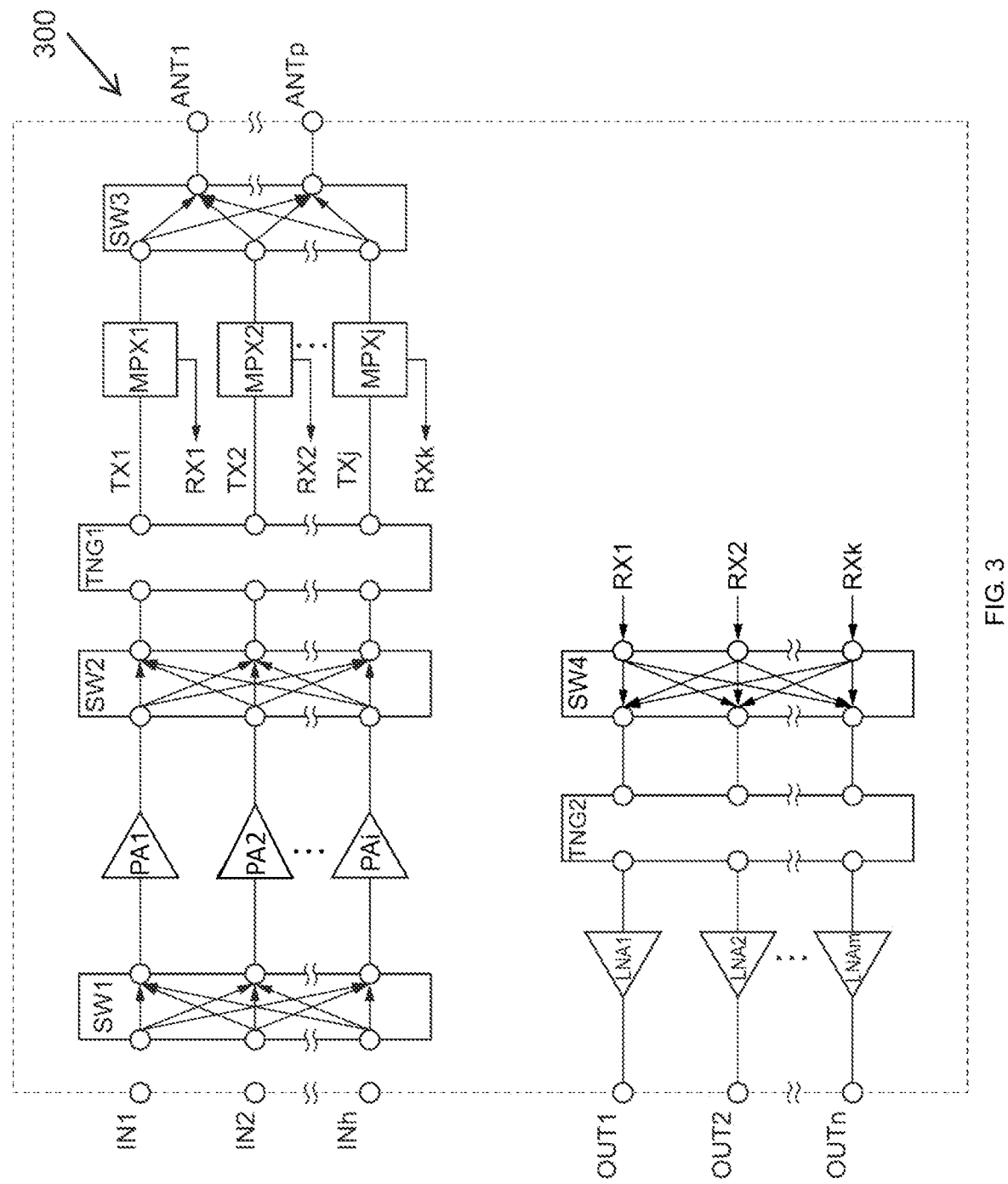
FIG. 3 is a block diagram schematically illustrating a circuit configuration of a multi-band power amplifier module according to a third embodiment.

Next, the configuration of a multi-band power amplifier module 300 according to a third embodiment of the present disclosure will be described with reference to FIG. 3. FIG. 3 is a block diagram schematically illustrating a circuit configuration of the multi-band power amplifier module 300 according to the third embodiment.

The multi-band power amplifier module 300 includes the plurality of transmission input terminals IN1, IN2, . . . , and INh, the transmission input switch SW1, the plurality of power amplifier circuits PA1, PA2, . . . , and PAi, the transmission output switch SW2, the first tuning circuit TNG1, the plurality of multiplexers MPX1, MPX2, . . . , and MPXj, the antenna switch SW3, and the plurality of transmission output terminals ANT1, . . . , and ANTp.

The multi-band power amplifier module 300 further includes a reception input switch SW4, a second tuning circuit TNG2, a plurality of low-noise amplifier circuits LNA1, LNA2, . . . , and LNAm, and a plurality of reception output terminals OUT1, OUT2, . . . , and OUTn.

The reception input switch SW4 outputs each of the plurality of received signals RX1, RX2, . . . , and RXk, which are input through the plurality of transmission output terminals ANT1, . . . , and ANTp via the plurality of multiplexers MPX1, MPX2, . . . , and MPXj, to one of the plurality of low-noise amplifier circuits LNA1, LNA2, . . . , and LNAm. The multi-band power amplifier module 300, which includes the reception input switch SW4, can selectively input each of the plurality of received signals RX1, RX2, . . . , and RXk to a suitable low-noise amplifier circuit. If the CCs of the plurality of received signals RX1, RX2, . . . , and RXk input to the multi-band power amplifier module 300 change, the reception input switch SW4 can switch paths in accordance with the changes of the CCs. Thus, the reduction in the efficiency of amplification of received signals can be prevented or minimized. The reception input switch SW4 is optional. That is, a specific multiplexer may be fixedly connected to each of a plurality of low-noise amplifier circuits.

The reception input switch SW4 may input two or more received signals to a single low-noise amplifier circuit or may input two or more received signals to different low-noise amplifier circuits. For example, when the frequencies of the respective CCs of the received signals RX1 and RX2 are close to each other or the bands of the respective CCs of the received signals RX1 and RX2 are identical, the reception input switch SW4 outputs the received signals RX1 and RX2 to the low-noise amplifier circuit LNA1. When the respective CCs of the received signals RX1 and RX2 are far apart from each other, the reception input switch SW4 outputs the received signal RX1 to the low-noise amplifier circuit LNA1 and outputs the received signal RX2 to the low-noise amplifier circuit LNA2.

The second tuning circuit TNG2 adjusts the impedance matching state between the plurality of multiplexers MPX1, MPX2, . . . , and MPXj and the plurality of low-noise amplifier circuits LNA1, LNA2, . . . , and LNAm. The second tuning circuit TNG2 is connected between the reception input switch SW4 and the plurality of low-noise amplifier circuits LNA1, LNA2, ..., and LNAm. The multi-band power amplifier module 300, which includes the second tuning circuit TNG2, can prevent or minimize the reduction in the efficiency of amplification of a received signal caused by a change in matching state between an output impedance of a low-noise amplifier circuit and a load impedance. For example, in a configuration including the reception input switch SW4 capable of selecting a path that connects a multiplexer and a low-noise amplifier circuit, if impedance matching between a multiplexer and a low-noise amplifier circuit is changed in accordance with a path selected by the reception input switch SW4, the second tuning circuit TNG2 can appropriately adjust impedance matching.

As an example, when the reception input switch SW4 simultaneously connects the multiplexers MPX1 and MPX2 to the low-noise amplifier circuit LNA1, the impedance matching state is different from that when only the multiplexer MPX1 is connected to the low-noise amplifier circuit LNA1. A circuit design is made such that the output impedance of the low-noise amplifier circuit LNA1 is matched to the load impedance when only the multiplexer MPX1 is connected to the low-noise amplifier circuit LNA1. In this case, the second tuning circuit TNG2 adjusts impedance matching in accordance with a change in impedance matching state, thereby preventing or minimizing the reduction in the efficiency of amplification of the received signal RX1 when both the multiplexers MPX1 and MPX2 are connected to the low-noise amplifier circuit LNA1.

The second tuning circuit TNG2 may be connected between the plurality of multiplexers MPX1, MPX2, ..., and MPXj and the reception input switch SW4. That is, the second tuning circuit TNG2 may be connected to the plurality of multiplexers MPX1, MPX2, ..., and MPXj, the reception input switch SW4 may be connected to the second tuning circuit TNG2, and the plurality of low-noise amplifier circuits LNA1, LNA2, ..., and LNAm may be connected to the reception input switch SW4. This configuration can also adjust the impedance matching state in accordance with paths of the plurality of received signals RX1, RX2, ..., and RXk that are selected by the reception input switch SW4.

The plurality of low-noise amplifier circuits LNA1, LNA2, ..., and LNAm amplify and output the plurality of received signals RX1, RX2, ..., and RXk, respectively. In the example illustrated in FIG. 3, m is an integer greater than or equal to 3, and the multi-band power amplifier module 300 includes m low-noise amplifier circuits LNA1, LNA2, ..., and LNAm. In the example configuration illustrated in FIG. 3, the number m of low-noise amplifier circuits is an integer greater than or equal to 3, which is equal to the number of received signals k, that is, m=k. It is desirable that the multi-band power amplifier module 300 include at least one low-noise amplifier circuit, and a plurality of received signals may be amplified by using a single low-noise amplifier circuit. Thus, it is desirable that $1 \leq m \leq k$.

The plurality of reception output terminals OUT1, OUT2, ..., and OUTn are terminals through which the plurality of received signals RX1, RX2, ..., and RXk amplified by the plurality of low-noise amplifier circuits LNA1, LNA2, ..., and LNAm are respectively output. The plurality of reception output terminals OUT1, OUT2, ..., and OUTn are connected to the plurality of low-noise amplifier circuits LNA1, LNA2, and LNAm. In the example configuration illustrated in FIG. 3, the number n of reception output terminals is greater than or equal to 3, which is equal to the number m of low-noise amplifier circuits. That is, n=m. It is desirable that the multi-band power amplifier module 300 include at least one reception output terminal, that is, $1 \leq n \leq k$.

Simulation Evaluation

Figure 4:
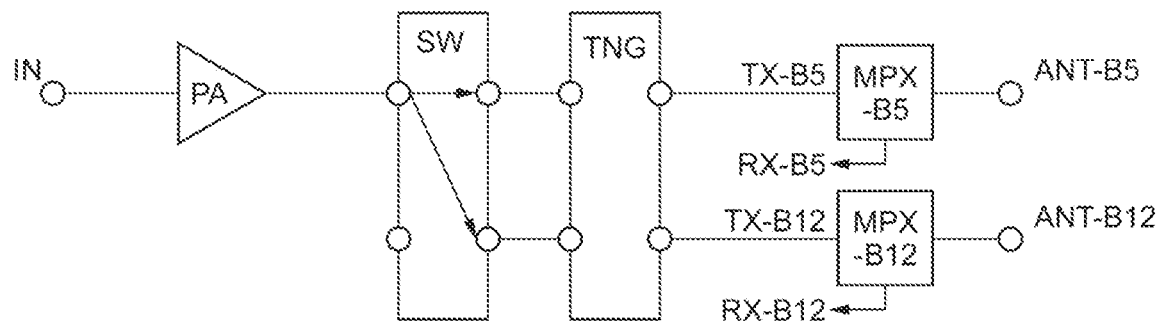
FIG. 4 is a block diagram illustrating a circuit configuration for impedance simulation in Example.
Figure 5:
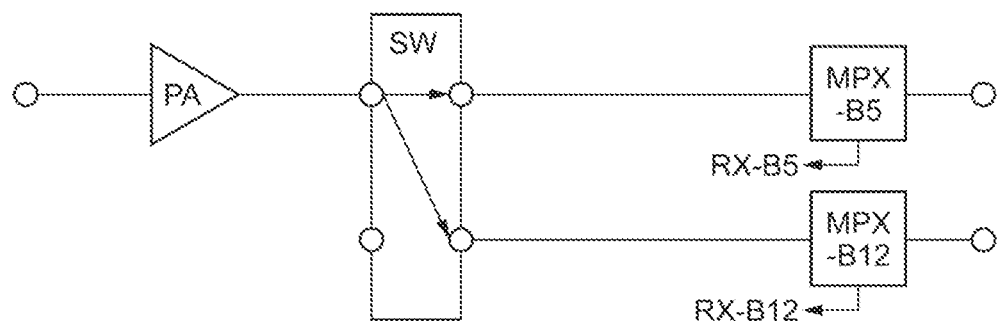
FIG. 5 is a block diagram illustrating a circuit configuration for impedance simulation in Comparative Example.
Figure 6:
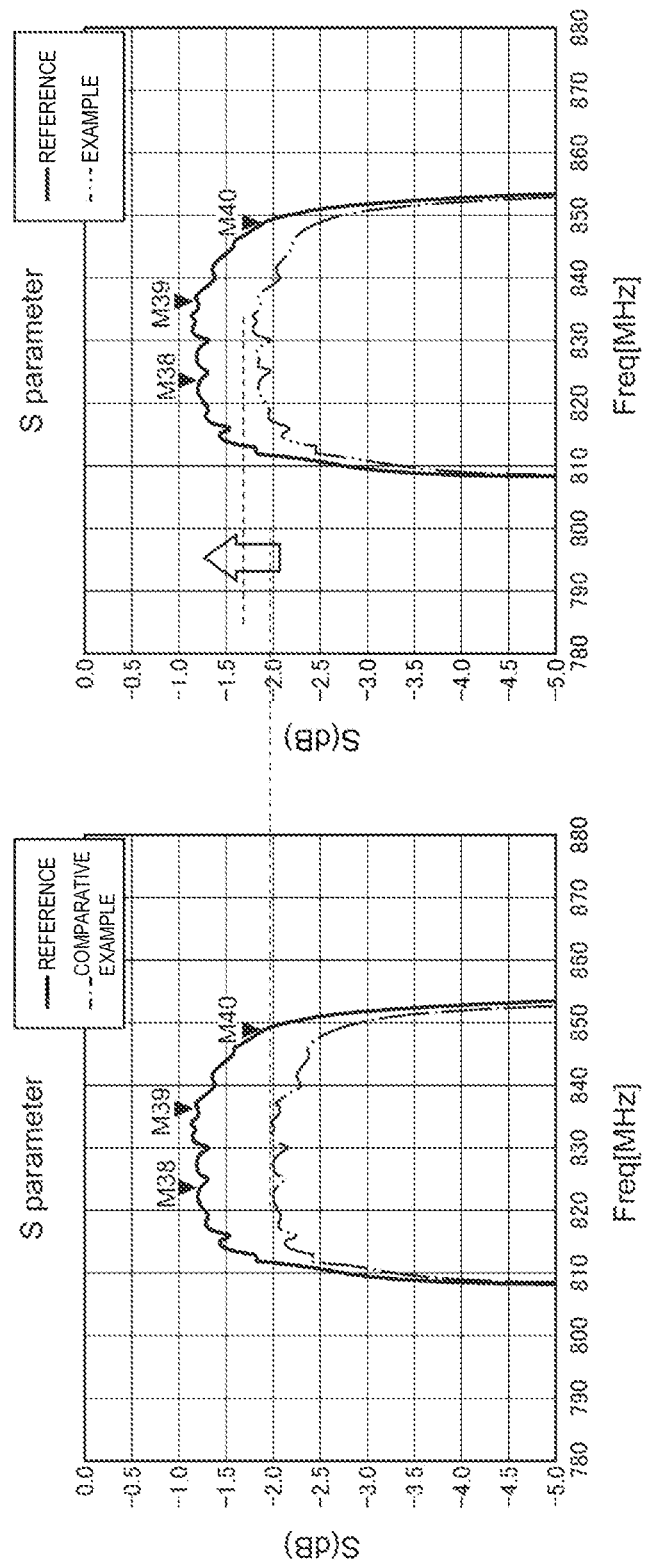
FIG. 6 is a graph depicting simulation results of band 5.
Figure 7:
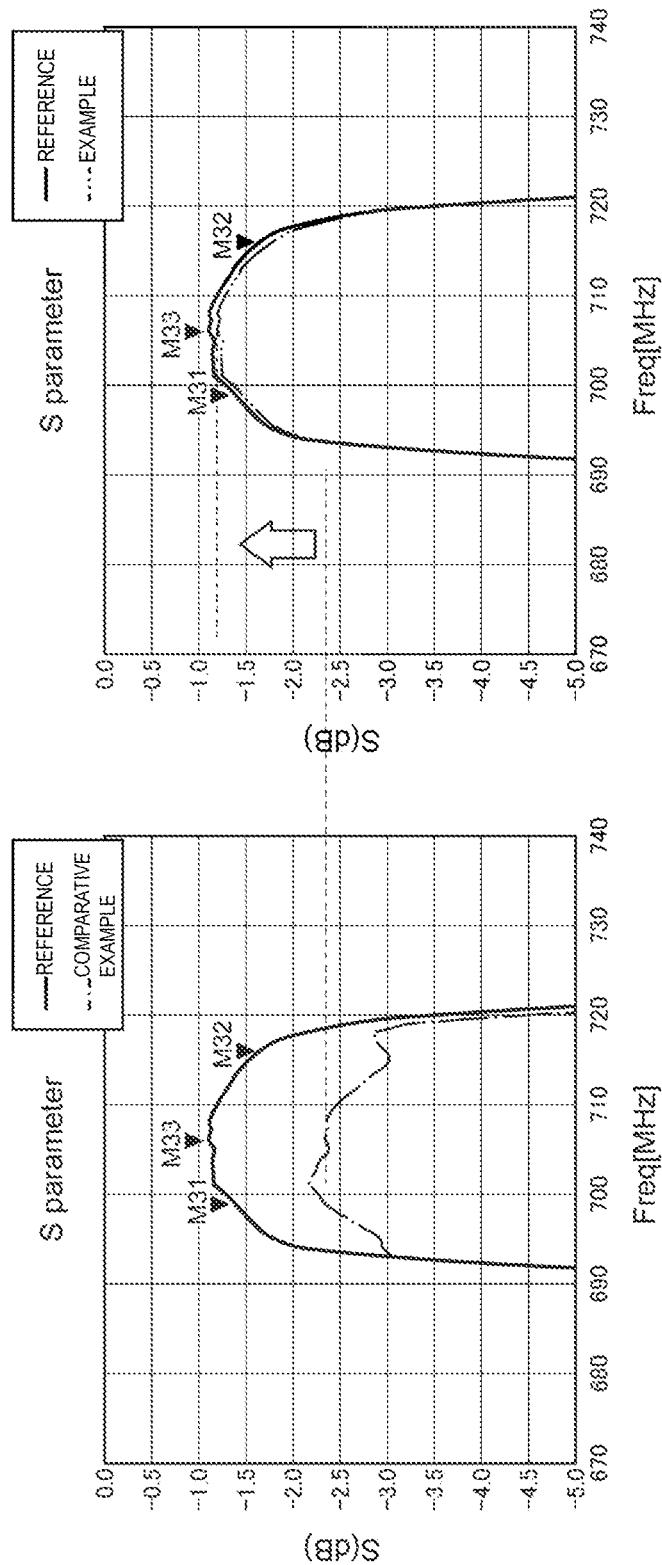
FIG. 7 is a graph depicting simulation results of band 12.

Next, simulation evaluation for the advantages achieved by the multi-band power amplifier modules 100, 200, and 300 according to the respective embodiments will be described with reference to FIGS. 4 to 7. FIG. 4 is a block diagram illustrating a circuit configuration in Example. FIG. 5 is a block diagram illustrating a circuit configuration in Comparative Example. FIG. 6 is a graph depicting simulation results of band 5. FIG. 7 is a graph depicting simulation results of band 12.

As illustrated in FIG. 4, a circuit according to Example includes a transmission input terminal IN, a power amplifier circuit PA, a transmission output switch SW, a tuning circuit TNG, two multiplexers MPX-B5 and MPX-B12, and two transmission output terminals ANT-B5 and ANT-B12. The transmission output switch SW connects the power amplifier circuit PA to the multiplexer MPX-B5 and also connects the power amplifier circuit PA to the multiplexer MPX-B12. In this circuit, a transmission signal TX-B5 of band 5 (uplink: 824 MHz-849 MHz) and a transmission signal TX-B12 of band 12 (uplink: 699 MHz-716 MHz) are simultaneously input through the transmission input terminal IN. The transmission signal TX-B5 passes through the multiplexer MPX-B5 and is output through the transmission output terminal ANT-B5. The transmission signal TX-B12 passes through the multiplexer MPX-B12 and is output through the transmission output terminal ANT-B12.

As illustrated in FIG. 5, Comparative Example provides a configuration obtained by removing the tuning circuit TNG from the circuit according to Example. Also, in Comparative Example, the transmission signal TX-B5 of band 5 and the transmission signal TX-B12 of band 12 are simultaneously input through the transmission input terminal IN. For the path between the power amplifier circuit PA and the multiplexer MPX-B5, the output impedance of the power amplifier circuit PA is set to be matched to the load impedance when the multiplexer MPX-B5 is connected alone to the power amplifier circuit PA without necessarily the intervention of a tuning circuit. For the path between the power amplifier circuit PA and the multiplexer MPX-B12, the output impedance of the power amplifier circuit PA is set to be matched to the load impedance when the multiplexer MPX-B12 is connected alone to the power amplifier circuit PA without necessarily the intervention of a tuning circuit.

The scattering parameters (S-parameters) on the transmission output terminal ANT-B5 side in Example and Comparative Example were simulated by using as a reference the S-parameter obtained when the multiplexer MPX-B5 is connected alone to the power amplifier circuit PA without necessarily the intervention of a tuning circuit. Also, the S-parameters on the transmission output terminal ANT-B12 side in Example and Comparative Example were simulated by using as a reference the S-parameter obtained when the multiplexer MPX-B12 is connected alone to the power amplifier circuit PA without necessarily the intervention of a tuning circuit.

As illustrated in FIG. 6, the S-parameter on the transmission output terminal ANT-B5 side in Example is enhanced compared with the S-parameter on the transmission output terminal ANT-B5 side in Comparative Example. As illustrated in FIG. 7, the S-parameter on the transmission output terminal ANT-B12 side in Example is enhanced compared with the S-parameter on the transmission output terminal ANT-B12 side in Comparative Example.

As described above, an aspect of the present disclosure provides a multi-band power amplifier module including at least one transmission input terminal, at least one power amplifier circuit that receives a first transmission signal and a second transmission signal through the at least one transmission input terminal, a first filter circuit that allows the first transmission signal to pass therethrough, a second filter circuit that allows the second transmission signal to pass therethrough, at least one transmission output terminal through which the first and second transmission signals output from the first and second filter circuits are output, a transmission output switch that outputs each of the first and second transmission signals output from the at least one power amplifier circuit to the first filter circuit or the second filter circuit, and a first tuning circuit that adjusts impedance matching between the at least one power amplifier circuit and the at least one transmission output terminal.

According to the aspect described above, a tuning circuit can prevent or minimize the reduction in the efficiency of amplification of a transmission signal caused by a change in matching state between an output impedance of a power amplifier circuit and a load impedance. In addition, a transmission output switch enables each of a plurality of transmission signals to be selectively input to a suitable filter circuit. If the CCs of a plurality of transmission signals respectively output from a plurality of power amplifier circuits change, the transmission output switch can switch paths in accordance with the changes of the CCs. Thus, each transmission signal can be output to an optimum filter circuit, and loss of transmission signals can be reduced. Furthermore, if the matching state between an output impedance of a power amplifier circuit and a load impedance changes depending on the path selected by the transmission output switch, the tuning circuit can appropriately adjust impedance matching. Since the transmission output switch is capable of separating transmission signals, the number of power amplifier circuits can be smaller than the number of filter circuits. This configuration can reduce the size and cost of the multi-band power amplifier module.

The multi-band power amplifier module may further include a transmission input switch that outputs each of the first and second transmission signals input through the at least one transmission input terminal to one of the at least one power amplifier circuit. This configuration enables each of a plurality of transmission signals to be selectively input to a suitable power amplifier circuit. If the CCs of a plurality of transmission signals input to the multi-band power amplifier module change, the transmission input switch can switch paths in accordance with the changes of the CCs. Thus, the reduction in the efficiency of amplification of transmission signals can be prevented or minimized. In addition, since the transmission input switch is capable of separating transmission signals, the number of power amplifier circuits can be smaller than the number of transmission input terminals. This configuration can reduce the size and cost of the multi-band power amplifier module.

The at least one power amplifier circuit may include a first power amplifier circuit configured to amplify both the first transmission signal and the second transmission signal, and the transmission output switch may simultaneously select a first path for outputting the first transmission signal from the first power amplifier circuit to the first filter circuit and a second path for outputting the second transmission signal from the first power amplifier circuit to the second filter circuit. With this configuration, the number of power amplifier circuits can be smaller than the number of filter circuits. In addition, the size and cost of the multi-band power amplifier module can be reduced.

The first tuning circuit may adjust impedances in accordance with a change in impedance matching state between when the transmission output switch selects the first path and when the transmission output switch selects both the first path and the second path. With this configuration, if a plurality of filter circuits is coupled to a single power amplifier circuit through the transmission output switch, the reduction in the efficiency of amplification of transmission signals in the power amplifier circuit can be prevented or minimized.

The first tuning circuit may be connected between the transmission output switch and the first and second filter circuits.

Another aspect of the present disclosure provides a multi-band power amplifier module including at least one transmission input terminal that receives a first transmission signal and a second transmission signal, at least one power amplifier circuit that receives the first transmission signal and the second transmission signal through the at least one transmission input terminal, a first filter circuit that allows the first transmission signal to pass therethrough, a second filter circuit that allows the second transmission signal to pass therethrough, at least one transmission output terminal through which the first and second transmission signals output from the first and second filter circuits are output, a transmission input switch that outputs each of the first and second transmission signals input through the at least one transmission input terminal to one of the at least one power amplifier circuit, and a first tuning circuit that adjusts impedance matching between the at least one power amplifier circuit and the at least one transmission output terminal.

According to the aspect described above, a tuning circuit can prevent or minimize the reduction in the efficiency of amplification of a transmission signal caused by a change in matching state between an output impedance of a power amplifier circuit and a load impedance. A transmission input switch is capable of selectively inputting each of a plurality of transmission signals to a suitable power amplifier circuit. If the CCs of a plurality of transmission signals input to the multi-band power amplifier module change, the transmission input switch can switch paths in accordance with the changes of the CCs. Thus, the reduction in the efficiency of amplification of transmission signals can be prevented or minimized. In addition, since the transmission input switch is capable of separating transmission signals, the number of power amplifier circuits can be smaller than the number of transmission input terminals. This configuration can reduce the size and cost of the multi-band power amplifier module.

The first tuning circuit may adjust the impedance matching state in accordance with an output level of at least one of the first and second transmission signals in the at least one power amplifier circuit. If the matching state between an output impedance of a power amplifier circuit and a load impedance changes in accordance with a change in output level, a tuning circuit can correct the impedance matching state. That is, the reduction in the efficiency of amplification of transmission signals in the multi-band power amplifier module, which is caused by the output level, can be prevented or minimized. For example, if the output levels of the first and second transmission signals are to be adjusted, such as when the distances between a device including the multi-band power amplifier module and a plurality of base stations that communicate with the device are different, the reduction in the efficiency of amplification of at least one of the first and second transmission signals can be prevented or minimized.

The first transmission signal and the second transmission signal may be included in an identical frequency range. That is, the multi-band power amplifier module may be configured to amplify a plurality of transmission signals in accordance with the intra-band contiguous CA scheme or the intra-band non-contiguous CA scheme.

The first transmission signal and the second transmission signal may be included in different frequency ranges. That is, the multi-band power amplifier module may be configured to amplify a plurality of transmission signals in accordance with the inter-band non-contiguous CA scheme.

The multi-band power amplifier module may further include an antenna switch that switches paths between the first and second filter circuits and the at least one transmission output terminal. With this configuration, the first and second transmission signals can be output to a single transmission output terminal and can be emitted from the same external antenna. That is, the number of transmission output terminals can be reduced.

The multi-band power amplifier module may further include at least one low-noise amplifier circuit, a reception input switch that outputs each of a first received signal output from the first filter circuit and a second received signal output from the second filter circuit to one of the at least one low-noise amplifier circuit, and a second tuning circuit that adjusts impedance matching between the first and second filter circuits and the at least one low-noise amplifier circuit.

With this configuration, the reception input switch enables each of a plurality of received signals to be selectively input to a suitable low-noise amplifier circuit. If the CCs of a plurality of received signals input to the multi-band power amplifier module change, the reception input switch can switch low-noise amplifier circuits to which the received signals are input in accordance with the changes of the CCs. Thus, the reduction in the efficiency of amplification of received signals can be prevented or minimized. In addition, a tuning circuit can prevent or minimize the reduction in the efficiency of amplification of a received signal caused by a change in matching state between an output impedance of a low-noise amplifier circuit and a load impedance. In a configuration including a reception input switch capable of selecting a path that connects a filter circuit and a low-noise amplifier circuit, the second tuning circuit adjusts impedance matching in accordance with a change in impedance matching state, thereby preventing or minimizing the reduction in the efficiency of amplification of the first received signal when both the first multiplexer and the second multiplexer are connected to the first low-noise amplifier circuit.

The second tuning circuit may be connected between the reception input switch and the at least one low-noise amplifier circuit.

As described above, according to an aspect of the present disclosure, it may be possible to provide a multi-band power amplifier module with improved efficiency of amplification of transmission signals.

The embodiments described above are intended to help easily understand the present disclosure and are not to be used to construe the present disclosure in a limiting fashion. Modifications or improvements may be made to the present disclosure without necessarily departing from the gist of the present disclosure, and their equivalents are also included in the present disclosure. That is, the embodiments may be appropriately modified in design by those skilled in the art, and such a modification also falls within the scope of the present disclosure so long as the modification includes the features of the present disclosure. For example, the elements included in the embodiments and the arrangement, materials, conditions, shapes, sizes, and so on thereof are not limited to those illustrated exemplarily but can be modified as appropriate. In addition, it is to be understood that the embodiments are illustrative, and configurations given in different embodiments may be partially replaced or combined. Such a replacement or combination also falls within the scope of the present disclosure so long as the replacement or combination includes the features of the present disclosure.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A multi-band low-noise amplifier module comprising:
a plurality of low-noise amplifier circuits;
a reception input switch configured to selectively connect each of the plurality of low-noise amplifier circuits to a corresponding one of a plurality of filter circuits such that a first received signal output from a first of the plurality of filter circuits and a second received signal output from a second of the plurality of filter circuits are each transmitted to a corresponding one of the plurality of low-noise amplifier circuits; and
a tuning circuit that adjusts impedance matchings between the first and second filter circuits and the plurality of low-noise amplifier circuits,
wherein the tuning circuit is connected between the reception input switch and the plurality of low-noise amplifier circuits,
wherein a difference between frequencies of a first component carrier of the first received signal and frequencies of a second component carrier of the second received signal when the reception input switch is in a first state is less than the difference between frequencies of the first component carrier of the first received signal and frequencies of the second component carrier of the second received signal when the reception input switch is in a second state,
wherein in the first state, the reception input switch is configured to transmit the first received signal and the second received signal to a same one of the plurality of the low-noise amplifier circuits, and
wherein in the second state, the reception input switch is configured to transmit the first received signal and the second received signal to different ones of the plurality of the low-noise amplifier circuits.

2. The multi-band low-noise amplifier module according to claim 1, wherein the frequencies of the first component carrier of the first received signal and the frequencies of a second component carrier of the second received signal are identical when the reception input switch is in the first state.

3. A multi-band power amplifier module comprising:
at least one transmission input terminal;
a plurality of power amplifier circuits that receive a first transmission signal and a second transmission signal through the at least one transmission input terminal;
a first filter circuit that passes the first transmission signal;
a second filter circuit that passes the second transmission signal;
at least one transmission output terminal through which the first transmission signal and the second transmission signal from the first and second filter circuits are output;
a transmission output switch that selectively transmits each of the first transmission signal and the second transmission signal output from the at least one power amplifier circuit to the respective first and second filter circuits; and a first tuning circuit that adjusts impedance matching between the at least one power amplifier circuit and the at least one transmission output terminal, wherein a difference between frequencies of a first component carrier of the first transmission signal and frequencies of a second component carrier of the second transmission signal when the transmission output switch is in a first state is less than the difference between frequencies of the first component carrier of the first transmission signal and frequencies of the second component carrier of the second transmission signal when the transmission output switch is in a second state, wherein in the first state, the transmission output switch is configured to transmit the first transmission signal and the second transmission signal to a same one of the plurality of the power amplifier circuits, and wherein in the second state, the transmission output switch is configured to transmit the first transmission signal and the second transmission signal to different ones of the plurality of the power amplifier circuits.

4. The multi-band low-noise amplifier module according to claim 3, wherein the frequencies of the first component carrier of the first transmission signal and the frequencies of a second component carrier of the second transmission signal are identical when the transmission output switch is in the first state.

5. The multi-band power amplifier module according to claim 3, further comprising:

a transmission input switch that selectively transmits each of the first transmission signal and the second transmission signal input through the at least one transmission input terminal to the at least one power amplifier circuit.

* * * * *